United States Patent [19]

Baggen

[11] Patent Number: 5,022,031
[45] Date of Patent: Jun. 4, 1991

[54] SEMICONDUCTOR MEMORY COMPRISING AN ON-CHIP ERROR CORRECTION DEVICE, AND INTEGRATED CIRCUIT COMPRISING SUCH A SEMICONDUCTOR MEMORY

[75] Inventor: Constant P. M. J. Baggen, Eindhoven, Netherlands

[73] Assignee: U.S. Philips Corporation, New York, N.Y.

[21] Appl. No.: 526,968

[22] Filed: May 22, 1990

Related U.S. Application Data

[63] Continuation of Ser. No. 235,249, Aug. 22, 1988, abandoned.

[30] Foreign Application Priority Data

Aug. 26, 1987 [NL] Netherlands ............... 8701996

[51] Int. Cl.⁵ ............................................. G06F 11/10
[52] U.S. Cl. ....................................... 371/43; 371/40.4

[58] Field of Search ................... 371/43, 44, 45, 13, 371/40.1, 40.4, 40.2; 365/200

[56] References Cited

U.S. PATENT DOCUMENTS 4,604,749 8/1986 Shinoda ........................... 371/13 X Primary Examiner—Clark A. Jablon
Assistant Examiner—Robert W. Beausoliel
Attorney, Agent, or Firm—Anne E. Barschall

[57] ABSTRACT

A description is given of a semiconductor memory with an on-chip error correction facility. The code used is defined over the location domain of the columns. The columns are arranged in patterns of non-redundant and redundant memory cells which recur with a fixed period. As a result of the convolution code chosen, decoding is possible by way of a small number of series connected gates, so that the time delay is limited. The correction capability of the code is only partly used because complete use could cause additional delay.

33 Claims, 3 Drawing Sheets

SEMICONDUCTOR MEMORY COMPRISING AN ON-CHIP ERROR CORRECTION DEVICE, AND INTEGRATED CIRCUIT COMPRISING SUCH A SEMICONDUCTOR MEMORY

This is a continuation of copending application Ser. No. 07/235,249 filed on Aug. 22, 1988, now abandoned.

BACKGROUND OF THE INVENTION, EXEMPLARY PRIOR ART

The invention relates to a semiconductor memory, comprising a memory matrix of rows and columns of memory cells for storing, per row, data information and also error protective redundant information, said memory comprising an on-chip error correction device which is fed by column outputs of the memory matrix, for receiving one symbol for each accessed column, and first column selection means which are fed by said error correction device in order to present output signals for further use.

A semiconductor memory of this kind is described in U.S. Pat. No. 4,604,749. The known memory is a read-only memory (ROM). In addition to the first column selection means, the memory also comprises second column selection means which are connected between the memory matrix and the correction device. These second column selection means select a comparatively small number of columns, so that a comparatively short code word is presented to the error correction device. It will be apparent that the terms "columns" and "rows" can be interchanged throughout in the reference. The described code is a so-called shortened (38, 32, 3) Hamming code with 38 code bits, 32 data bits and a minimum distance of 3 over the bits. As a result, a single-bit error can be corrected in 32 data bits, using a redundancy of $6/32 = 19\%$. The first column selection means select each time a single byte (8 bits) from the 32-bit word, which byte appears on an output. The efficiency of this code is comparatively low. Improvement of the efficiency would necessitate a longer code word, however, the implementation is already complex for an 38-bit code word. On the one hand this requires a comparatively large surface area on the integrated circuit and on the other hand the time required for decoding is comparatively long, so that the memory will be slower. Finally, the described organization is not suitable for a random access memory (RAM).

SUMMARY OF THE INVENTION

Among other things, it is an object of the invention to provide an improved semiconductor memory with a degree of error protection which can be adapted to the desired reliability and with an efficiency which is higher than that of the known memory, if desired; in which memory the delay incurred amounts to only a few gate delay times, and its set-up being suitable for a multitude of applications; it is a secondary object to enable the correction of incidental errors occurring during operation as well as of permanent (stuck-at) errors occurring during manufacture or at a later stage by means of the selected correction facilities, which errors may have a random configuration as well as be concentrated on a given column, so that the operating quality of an installed semiconductor memory can be maintained, or that a semiconductor memory containing errors can act as an error-free memory vis-a-vis the environment, so that in the latter case the yield of the manufacturing process can be increased or the price per circuit can be reduced.

According to one of its aspects the object of the invention is reached in that it is characterized in that the memory matrix in the row direction comprises a succession of at least two patterns of n columns each, in that the error correction device is connected to the column outputs for operating according to an (n,k) spatial convolution code, wherein $n > k$, inasmuch within a said pattern the redundant information fills a predetermined fixed fraction $(n-k)/n$ of the pattern, said error correction device comprising the following four functional stages for each complete pattern:

a. an input stage for forming a presyndrome (am) and at least one subsidiary syndrome symbol from the information received from the memory cells;

b. a second stage for receiving at least one subsidiary syndrome symbol (bm) from a neighbouring pattern in a first direction, if present, and for forming a local syndrome by means of the local presyndrome;

c. a combination stage for forming, from the local syndrome and at least one syndrome symbol of a neighbouring pattern in a second direction, if present, a modification signal for each information signal to be applied to the first column selection means;

d. a modification stage for modifying an information signal under the control of a respective modification signal.

In the above, a symbol is a bit group of standard length that is uniform over the code, e.g. one, two, four, eight bits, other lengths being applicable as well. All calculations are done in the appropriate Galois field. In the scope of the invention a column may store one symbol per row and therefore the word column may have a wider stract meaning than according to standard memory technology that restricts to single bit symbols. On a technology level, the present invention need not depart from conventional bit-organized storage, it is only that a plurality of bit storage position form part of a single-symbol column.

The code may either be systematic or non-systematic on the level of a symbol. Systematic codes are easier to decode, non-systematic codes have shorter constraint length sometimes and therefore a higher correction capability.

A spatial convolution code is to be understood to mean a code for which the delay operator D of the generating polynomial does not have the meaning of a symbol cell delay in time, but rather the meaning of a shift in space over one pattern. The patterns may be arranged in a finite series. In that case the first complete pattern is not preceded by any neighbouring pattern in the first direction. The last complete pattern is then followed in the second direction by a series of one or more incomplete patterns or the first pattern is preceded by one or more incomplete patterns. The patterns may also be arranged in a quasi-infinite series. In that case the first complete pattern is preceded in the first direction directly by the last pattern in the second direction in that the necessary looping through for signals is provided. In that case no incomplete patterns need be provided. Alternatively, there may be formed a combination so that in the first and/or the second direction one or more incomplete final patterns are present, a given looping through of signals also being provided.

A pattern is a notional group of columns. In principle these groups can be arranged so as to be interleaved; this can be realized by means of the second column selection means. This arrangement may sometimes be advantageous, for example when "burst errors" occur. These burst errors can occur if the effect of a so-called pinhole is likely to extend across two (or more) adjoining columns. Another advantage may be that connection lines could be shorter and/or the surface area required could be smaller and/or the delay times could be shorter.

The invention can be used notably in very large semiconductor memories, for example 1 Mbit per chip. Due to the repetitive patterns, at least one symbol error can be corrected per constraint length which is a term known from the theory of convolution codes. In contrast therewith, the cited semiconductor memory uses a block code. At the end of the series of patterns only a small amount of additional redundancy may be required. The code can be systematic at the bit level; this results in a simple correction device. The code may also be non-systematic at the bit level. This necessitates matrix inversion (known per se) after the correction. The advantage of a non-systematic code sometimes consists in the smaller constraint length, so that the correction capability is de facto increased. If some steps are taken, the invention can also be used for a random access memory (RAM) or even for a dynamic RAM memory for the realization of the refresh organization. Furthermore, the error protection thus realized can be combined extremely well with the protection against faulty rows of memory cells by means of redundant rows of cells which can act as substitutes. In principle, the efficiency of the code in accordance with the invention may be either higher or lower than that of the known memory.

FURTHER ASPECTS OF THE INVENTION

Preferably, second column selection means are connected between the memory matrix and the correction device. Such second column selection means are known from the state of the art, but the proportioning in accordance with the invention is usually completely different. In the case of a 1Mbit memory, there will be 1024 data columns (32 words of 32 bits). The known memory then comprises, for example $32 \times 38 = 1216$ columns in total. The selection factor of the second column selection means then amounts to 32; the selection factor of the first column selection means then amounts to only 4. In accordance with the present invention, in the case of a (9, 8) looped-through code there are, for example $128 \times 9 = 1152$ columns. The selection factor of the second column selection means then amounts to, for example 4: from every four successive columns (4p, 4p+1, 4p+2, 4p+3), where p=0, 1, 2, . . . , each time the column 4p+q is then selected, where q is independent of p and selectable as 0, 1, 2, 3. The selection factor of the first column selection means then amounts to, for example 32. It will be apparent that the proportioning may also be different.

The invention also relates to an integrated circuit comprising a semiconductor memory of the described kind. Such a circuit may comprise, for example, several semiconductor memories which are provided all or in part with an on-chip error correction device. Alternatively, other sub-systems may be present, for example an arithmetic and logic unit, an input/output sub-system and an interconnecting bus system, a memory management unit, and others.

Further aspects of the invention are recited in the other claims.

BRIEF DESCRIPTION OF THE FIGURES

The invention will be described in detail hereinafter with reference to the figures in particular relating to an (n, n−1) code that is systematic and has single bit symbols. Other convolutional codes are known in the art, principally for use with data communication along serial lines. In the figures.

SYSTEM DESCRIPTION

Figure 1:
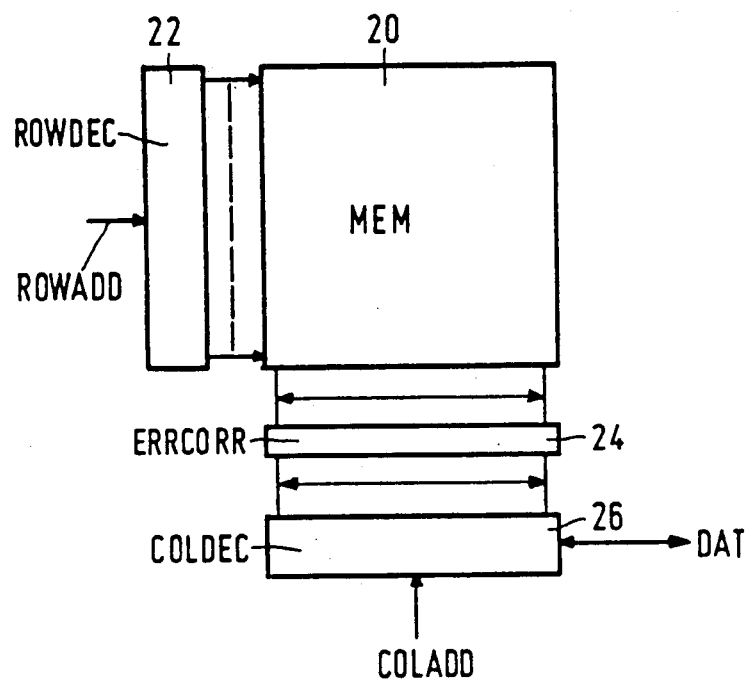
FIG. 1 shows a block diagram of a memory in accordance with the invention.

FIG. 1 shows a block diagram of a memory in accordance with the invention. The entire device is accommodated on a single integrated circuit.

Element 22 is the row decoder; this decoder receives a row address, for example consisting of 10 bits, whereby one of at the most 1024 rows of memory cells is addressed. The row decoder may include a permanent translation of the address of one or more rows found to be faulty into the address of a respective substitute redundant row. Assume that the aim is to have 1024 information bits available per row after correction. In accordance with a code having an efficiency amounting to ¾, to be described hereinafter, a row should then contain 1367 code bits which appear on the data outputs of the memory matrix after the addressing of the row. (In practice, for example in order to save electric power, a matrix of $1024 \times 1367$ cells will usually be subdivided into four submatrices of 512 rows and a number of columns which is slightly larger than 1367:2, for example, 685, the exact number being determined by the implementation; however, this subdivision will not be elaborated herein). Element 24 is an error correction device which has a mainly modular construction and which will be described in detail hereinafter. For an efficiency amounting to ¾, the total 1Mbit matrix can now output 1024 data bits. These data bits will be corrected for many errors, even though it always remains possible that non-correctable errors were present. When these errors concern manufacturing errors, they can be detected during manufacture. However, during this detection the error correction device can be deactivated by a special user-controlled test signal. Further hard errors can also arise during later use. The resultant number of 1024 is not output in parallel. To this end there are provided first column selection means (column decoder) 26. If only 1 bit is to be selected, this decoder receives a 10-bit column address. When the data connection has a path width of 8 bits, a 7-bit address suffices. The column decoder 26 thus has a known multiplexer function.

The error correction device receives a series of patterns of bits, for example each time n=2, 4, 8 or 16 bits per pattern. At one or at both ends these patterns may be supplemented by a number of partial patterns as will be described hereinafter. For each pattern each time n=1, 3, 7, 15... bits are output in a preferred embodiment. For the partial patterns this number is smaller than the standard number for the relevant code. In a preferred embodiment, all codes are systematic at the bit level as will be explained hereinafter. Further, convolution in the time domain is known per se. The present invention, however, utilizes convolution codes in the spatial domain; moreover, the use in matrix memories has far-reaching consequences for the decoding.

In addition to the described components, the semiconductor memory shown in FIG. 1 may also comprise further components such as:

a second and further memory matrices, components for data processing, such as ALU, buses, I/O organization;

second column selection means which are connected between the matrix and the associated error correction device for effecting spatial interleaving; these means select one column from each group of two, four, etc. columns in order to connect it to the input of the error correction device. The selection factor of these second column selection means is then smaller than that of the first column selection means;

means for initiating write operations with associated encoding in order to form the necessary redundancy per pattern;

a refresh control system which regularly presents memory addresses in accordance with some procedure or other in order to read the part of the memory thus addressed and fill it again with the same information (corrected or not). Various strategies are feasible for the formation of the addresses.

DESCRIPTION OF SOME ERROR CORRECTION DEVICES

Figure 2:
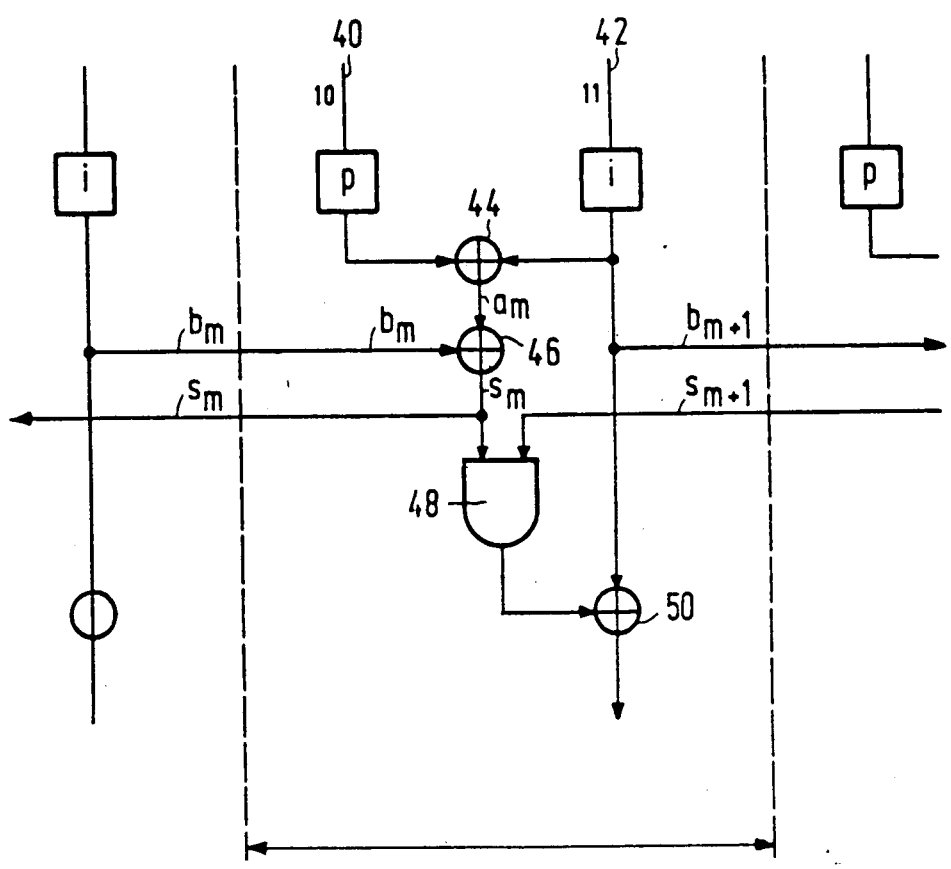
FIG. 2 shows a block diagram of an error correction device with a code efficiency amounting to ½.

FIG. 2 shows a block diagram of an error correction device having a code efficiency amounting to ½. Between the vertical broken lines a single pattern period is shown. This simple example involves one parity bit line (column line) 40 and one data bit line (42). When a row of memory cells is activated, one bit appears on all activated column lines. In an input stage 44 a presyndrome bit (am) is formed from these two bits by means of an EXCLUSIVE-OR function. Furthermore, in this simple case the data bit is treated as a first subsidiary syndrome bit. In the second stage of the error correction device the subsidiary syndrome bit of the left-neighbouring pattern period and the local presyndrome bit are used to form a syndrome bit sm by means of an EXCLUSIVE-OR element 46. If there is no left-neighbouring period, bm=0 and the element 46 may be omitted, if desired. In a combination stage a modification bit is formed from the local syndrome bit sm and the syndrome bit of the right-neighbouring pattern period by means of an AND-gate 48. The digits stated in the supply leads for the bits originating from the memory cells indicate in which pattern period the relevant bit is used. The first 1 indicates that both bits are used for the relevant period. The second bit indicates whether the relevant bit received is used (1) or not (0) for the right-next pattern period. In this case only the data bit is used. When the pattern period in question (m) is the last complete pattern period, only the parity column need be provided for the next pattern period, the full correction capability still being maintained for the last complete pattern period. For this additional parity period the elements 44, 48, 50 could in principle be omitted. The various possibilities for the terminating columns will be described hereinafter. Finally, in the modification stage 50 the data to be output is modified, if necessary, by means of an EXCLUSIVE-OR function.

Figure 3:
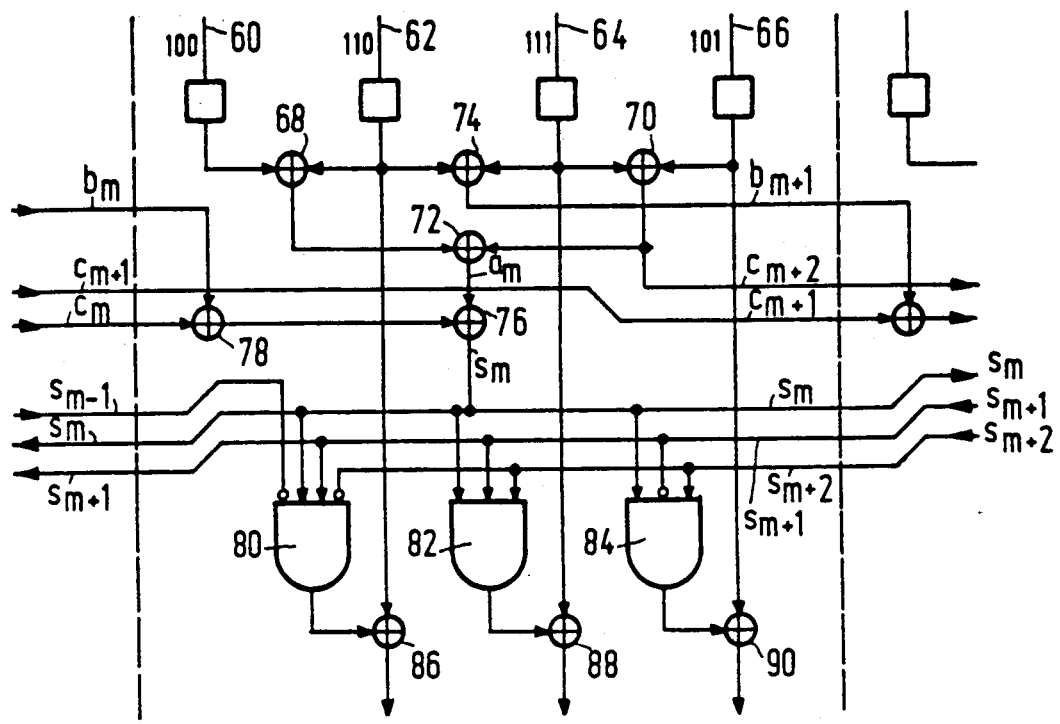
FIG. 3 shows a similar block diagram for an efficiency amounting to ⅔.

FIG. 3 shows a similar block diagram for an efficiency amounting to ⅔. The bits fetched from the memory cells appear on four column lines 60, 62, 64, 66. The three bits given for each incoming bit line indicate the pattern period for which the respective bit is relevant.

In the correction device a presyndrome bit am is formed in a first stage from the four bits received, using three EXCLUSIVE-OR functions 68, 70, 72. If none of the four bits received is disturbed, this presyndrome bit has the value zero. Furthermore, in parallel therewith, the presyndrome bit $b(m+1)$ is formed by means of the EXCLUSIVE-OR function 74. Furthermore, again in parallel therewith, a second subsidiary syndrome bit $c(m+2)$ is formed by means of the EXCLUSIVE-OR function 70 which has also been used for the presyndrome. A suitable choice of the respective EXCLUSIVE-OR functions aims to minimize the number of these functions and also to realize a short delay time for the signals.

Using the local syndrome bit sm, the first subsidiary syndrome bit of the left-neighbouring pattern period (bm) and the second subsidiary syndrome bit (cm) of the left-neighbouring pattern period but one, the local syndrome bit sm is formed in a second stage by means of EXCLUSIVE-OR functions 76, 78.

The third stage consists of three AND-gates 80, 82, 84, each gate for a respective data bit to be output, comprising partly inverted inputs which are denoted by a circle. Each of these three AND-gates receives the local and non-inverted syndrome bit. They all receive also (possibly inverted) the syndrome bit $s(m+1)$ of the right-neighbouring pattern period and also the syndrome bit $s(m+2)$ of the right-neighbouring pattern period but one. The gate 80 also receives (inverted) the syndrome signal of the left-neighbouring pattern period. The inversion of the data bits for correction is again realized by means of three EXCLUSIVE-OR functions 86, 88, 90.

The code used resembles the code in the time domain proposed by Wyner and Ash (Peterson and Weldon, Error correcting codes, M I T Press, Cambridge Mass./London, 1972, page 402). In the present application, however, the decoding is unconventional. For example, the syndrome is not updated for errors corrected in other pattern periods because that would cause in an excessive delay. In principle each time only 1 bit error can be corrected within the constraint length. This constraint length amounts to 17 bits in FIG. 3. This means that two arbitrary, incorrect bits can be corrected with certainty if they are separated by at least 17 non-disturbed (code) bits. The constraint length relates to the most unfavourable case. In given error configurations the distance may be less than 17 bits. The constraint length can usually be further reduced by utilizing a non-systematic code.

Figure 4:
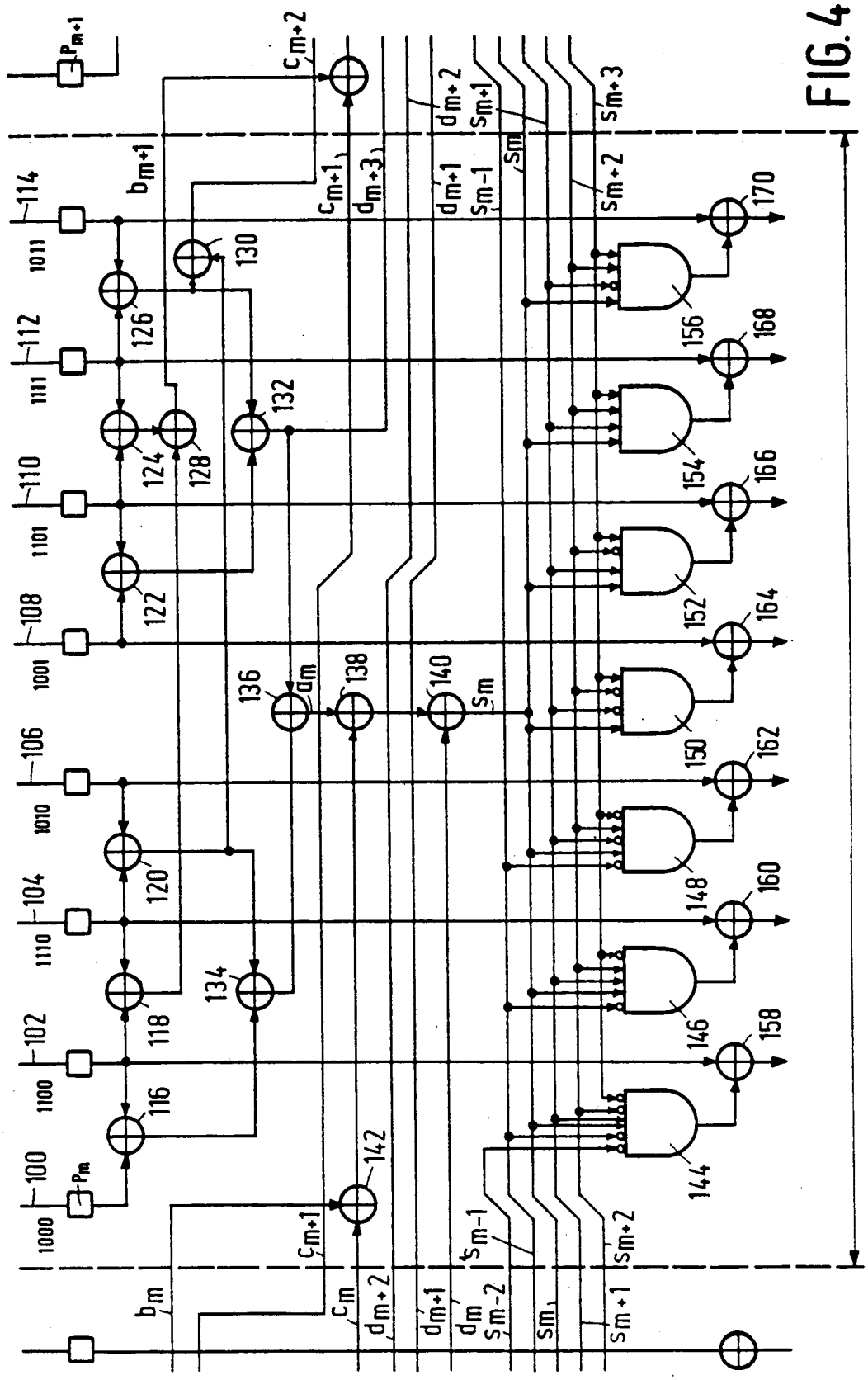
FIG. 4 shows a similar block diagram for an efficiency amounting to ⅘.

FIG. 4 shows a diagram which corresponds to FIG. 3 for an efficiency amounting to ⅙. The constraint length is 51 bits, so that always 1 bit can be corrected for at the most 52 bits. On the bit line 100 a parity bit appears, while a data bit appears each time on the lines 102-114. The EXCLUSIVE-OR gates 116, 120, 122, 126, 132, 134, 136 form a presyndrome bit. Furthermore, the following subsidiary syndrome bits are formed for use in other pattern periods:

the bit b(m+1) for the right-next pattern period by means of the EXCLUSIVE-OR gates 118, 124, 128;

the bit c(m+2) for the right-next pattern period but one by means of the EXCLUSIVE-OR gates 120, 126, 130;

the bit d(m+3) for the right-next pattern period but two by means of the EXCLUSIVE-OR gates 122, 126, 130.

In the second stage the corresponding subsidiary syndrome bits bm, cm, dm are processed in order to form the local syndrome bit sm from the local presyndrome bit am, that is to say in the following EXCLUSIVE-OR gates:

bm: 142, 138, 140
cm: 142, 138, 140
dm: 140.

The third stage consists of seven AND-gates with partly inverted inputs 114-156, i.e. one for each data bit to be output. In these combination gates the syndrome bit of the current pattern period is combined with the syndrome bit of the first, the second and the third most-neighbouring periods at the right and with the syndrome bits of the first and the second most-neighbouring pattern periods at the left.

In a fourth stage, the respective bits read are updated by means of the EXCLUSIVE-OR gates 158-170, utilizing the modification bits formed in the gates 144-156.

In the above, it is possible in principle for any pattern to have a lesser number of non-redundant columns. This is solved by feeding the decoder with logical zeroes for this column and omitting the associated bit output. Often, further simplifications may then be introduced.

THE FACILITIES AT THE TERMINATIONS

FIGS. 2-4 show the situation for a quasi-infinite row of pattern periods. In FIG. 2 at least one further pattern period is provided at each end; in FIG. 3 at least two of such periods are provided at both ends, while in FIG. 4 at least three of such pattern periods are provided at both ends. This condition is not satisfied at the beginning of the series of pattern periods.

In FIG. 2 the subsidiary syndrome bit bm standard has the value zero, or it is not provided; the output of the syndrome bit sm to the left can be omitted. In FIG. 3 the subsidiary syndrome bits bm, cm, cm+1, standard have the value zero, or they are not provided and the EXCLUSIVE-OR gates fed thereby can be omitted, if desired. The output of the syndrome bits sm, s(m+1) to the left can then be omitted. The applied syndrome bit s(m-1) standard has the value 0, or the relevant input of the gate 80 is not provided. In FIG. 4 the subsidiary syndrome bits bm, sm, c(m+1), dm, d(m+1), d(m+2) standard have the value zero, or they are not provided, and the EXCLUSIVE-OR gates fed thereby can be omitted, if desired. The output of the syndrome bits sm, s(m+1), s(m+2) to the left can be omitted. The applied syndrome bits s(m-2), s(m-1), standard have the value 0, or the relevant inputs of the gates 144, 146, 148 are not provided (all these gates receive the inverted values of these signals !). The termination of the series of pattern periods to the left in this manner does not affect the correction capability of the spatial convolution code.

Generally, specific steps for correctly terminating the series must also be taken at the right-hand end of the series of pattern periods. A first possibility consists in the provision of partial pattern periods at the right-hand end. In FIG. 2 the bit line 40 concerns only the current pattern period and in the sole partial pattern period at the right-hand end this bit line should be provided. The bit line 42 would then also concern a non-existing pattern period, so that the latter need not be provided. The sequence of the bit lines at the right-hand end is then . . . 40, 42-40, 42-40.

In the configuration shown in FIG. 3, the bit line 60 (code 100) is relevant only for the respective pattern period. At the end of a series of pattern periods, this line (in a partial period) must still be provided as the last one. The other three lines of that period would also concern non-existing pattern periods, so that they would not make sense. The last period but one may then comprise at the most the bit lines 60, 62 (the lines 64, 66 with the code . . . , . . . , 1 would then concern a non-existing pattern period and hence would not make sense). The last pattern period but two may be complete. The sequence of the bit lines at the end of the row may therefore be: (60, 62, 64, 66)-(60, 62)-(60).

Similarly, in FIG. 4 the following bit lines may be provided at the end of the row of pattern periods: (100, 102, 104, 106, 108, 110, 112, 114)-(100, 102, 104, 106)-(100, 102)-(100).

The foregoing can be modified by omitting given bit lines (not the parity bit lines 40, 60, 100) if they are superfluous for the use of the memory. Example: 512:7=73+1. In the case of FIG. 4, different combinations of the lines 102-106 could be omitted from the last three partial periods. Generally, non-redundant columns of memory cells may be omitted at random (at least in the case of a systematic code). For example, an (8, 7) code can be converted into a (7, 6) code if this would be advantageous for the capacity of the memory.

The opposite can also take place, so that only complete pattern periods are provided, but the irrelevant column lines are not taken into account. In the case of a CAD system this could be advantageous because of the increased correspondence between successive pattern periods.

A third possibility where the surface area is also reduced consists in the cyclic looping through of the pattern periods. However, the total width of the memory must then be larger than the constraint length, because otherwise the code would be ineffective. In FIG. 4 the following signals are then output at the right-hand side: b(m+1), c(m+2), c(M+1), d(m+3), d(m+2), d(m+1), s(m-1), sm. Moreover, at this side the following signals are input: s(m+1), s(m+2), s(m+3). These eleven signals can be looped through in the row direction from one side of the series of pattern periods to the other side in order to be used in the relevant pattern periods. In FIG. 4 the drawbacks of these eleven signal paths must be considered in relation to three redundant memory columns. Depending on the dimensions of the memory, one solution or the other will be more attractive. In the solution given in FIG. 3, the trade-off would be four additional signal lines versus two additional columns of memory cells. Intermediate solutions are also feasible: if the series of pattern periods comprises the following numbers of bit lines: . . . , 8, 4, 2, 1 in FIG. 4, exclusively the last column of redundant memory cells can be included in the first complete pattern period; however, a large number of signals must then still be looped through.

FURTHER ELABORATIONS AND SUPPLEMENTS TO THE INVENTION

The invention can be extended and supplemented in various ways. First of all, the dimension of a pattern period can be modified. It can be extended, for example to 16, 32 columns. On the one hand the redundancy is thus reduced. On the other hand, the constraint length thus increases rapidly, so that the overall correction capability decreases. The determination of the optimum value, that is the optimum yield of the manufacturing process, is then co-determined by the number of expected errors, for example so-called pinholes.

A further drawback of a larger pattern period consists in that the logic depth of the error correction circuit increases, so that the circuit becomes slower. The de-activation of the error correction circuit in order to perfrom a test or to increase the processing speed in normal user circumstances is realized as follows. All AND-gates (so 144 . . . 156 in FIG. 4) are provided with an additional input. In the normal user condition, all additional inputs are activated with a logic "1", so that the error correction device operates in the described manner. In the test mode, all additional inputs are activated by means of a logic "0". As a result, all AND-gates output a logic "0" and the EXCLUSIVE-OR gates 158-170 operate as non-inverting gating elements. As a result, an external test can be performed on the data pattern delivered. However, in the example, the redundant column of memory cells itself cannot be tested in this manner. If strictly necessary, the data thereof can be applied to one of the external outputs by way of a multiplexer which has been omitted for the sake of simplicity.

Figure 5:
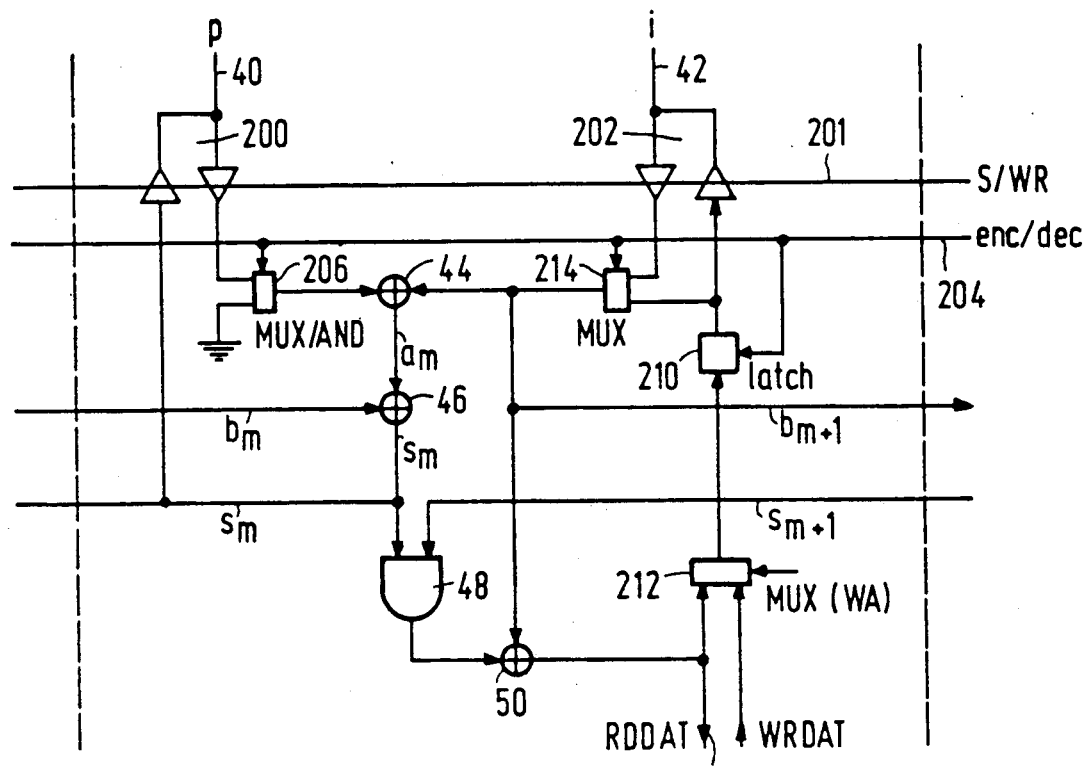
FIG. 5 shows an elaboration of FIG. 2 in order to form a random access memory.

FIG. 5 shows an extension of FIG. 2 in the form of a random access memory. The elements 40, 42, 44, 46, 48, 50 have already been described with reference to FIG. 2. The following additional parts are provided. First of all, there are provided bidirectional connecting stages 200/202 for each column of memory cells, possibly with an additional control line for activating only one of the two feasible directions. There is also provided an encoding/decoding control input 204. This input controls first of all the circuit 206. In a simple embodiment, the element 214 is omitted, but the data output of the column 42 is connected directly to inputs of EXCLUSIVE-OR elements 44 of the first stage and 50 of the modification stage. In an improved solution, a multiplexer 214 is connected therebetween, which multiplexer conducts its upper input upon decoding. During a decoding operation, the circuit 206 conducts the signal on the column 40 so that the signals am, sm and the possibly corrected data bit on the output 208 are formed in the previously described manner. Furthermore, during the decoding operation the series combination of the multiplexer 212 and the latch circuit 210 operates so that the corrected data thus formed does not initiate the writing of modified data: multiplexer 212 is generally maintained in the left-hand position and the decoding signal blocks the latch 210 so that the latter does not supply a signal. The multiplexer 212 is set to the right-hand position only by the write address (WA) for the columns for which new data is to be written. Another solution for the element 206 is formed by a logic AND-gate which is blocked by the encoding signal. During writing, the signal on the line 204 is initially activated for all columns in the same way as for a read operation. However, the signal for the multiplexer 212 is set to the right-hand position only for the columns to be selected (by means of the first column selection means). During writing it is also necessary to determine the redundancy to be written, which redundancy depends on the data bits to be newly written as well as on the data bits already present. Therefore, in principle the entire redundancy is determined anew. It would be possible to leave redundancy bits which are situated "far away" unaffected, but the comparatively complex control circuitry then required is not provided. During a first phase, the data to be newly written is stored, via the multiplexer 212, in the latch circuit 210 under the control of the encoding signal (212 is in the right-hand position). For the data bits to be maintained, the multiplexer 212 is in the left-hand position so that these bits are stored in the relevant latch circuits 210. If present, the multiplexer 214 is in the lower position so that this new data bit takes the place of the data bit thus far present in the memory cell. If the multiplexer 214 is not provided, it is assumed that the stationary output signal of the latch circuit 210 prevails over a dynamic output signal of the element 202. The multiplexer 206 then outputs a logic 0. As a result, without the influence of the redundancy stored thus far, the new redundancy is calculated by way of the elements 44, 46. During a subsequent write phase, the redundancy bit (which is the same as the syndrome bit when the local redundancy bit has the value zero during decoding) and the data bit are written via the elements 200/202.

For the versions shown in the FIGS. 3, 4 and generally for (n, n−1) spatial convolution codes corresponding solutions can be used; these solutions require first of all a blocking element between the output of the redundant columns and the associated input of the correction device. Secondly they require a hold element for all data bits and a controllable selection element, so that the newly received data bits as well as the data bits to be maintained can be stored therein, as desired. Finally, they require a feedback for applying the syndrome bits to the relevant columns of redundant memory cells. It is to be noted that in the described realization the syndrome bit is co-determined by already stored data bits of other parts of the memory (in this case represented by the bit bm; in the FIGS. 3, 4 by all signals bm (. . . ), c(. . . ), d(. . . ) described). Because the modifications are upon correction performed only in the modification stage (which stage is idle during the encoding), the correct redundant information will be stored. Other solutions are also possible, for example, solutions where the data bits to be maintained are read but not written again. To this end, the read/write control signal for the element 201 is co-determined by the write address WA. This will usually be a less attractive solution.

In a random access memory in dynamic MOS technology, refresh cycles must also be executed. In a simple embodiment, the information may remain unmodified. This can be realized in that the read/write elements 200, 202 have a sufficient node capacity for charging the cell node to an adequate voltage level during the sample mode after a precharge phase. A more refined solution consists in that a given degree of correction can be introduced by means of a circuit as shown in FIG. 5. However, in that case the control deviates from that in the case of a write operation. First of all, all multiplexers then occupy to the left-hand position. Moreover, during the read operation all elements 206 are controlled so as to be conductive for the redundancy bits. As a result, corrections are performed on the redundancy bit (via the elements 44, 46) as well as on the data bit (via the elements 44, 46, 48, 50), be it of course no more than once within the actual constraint length.

The code can be extended, if desired, to an (n, n−j) code, where j=2, 3, .... Generally, decoding will then be more complex. The solution shown in FIG. 4 can be extended to n=16, 32, ...; a higher efficiency will then be obtained.

What is claimed is:

1. A semiconductor memory, comprising:
   a memory matrix of rows and columns of memory cells for storing data information and error protective redundant information, wherein the memory matrix comprises a succession of at least two complete patterns in a row direction of n columns each;
   error correction means connected to column outputs of the memory matrix for operating according to an (n,k) spatial convolution code, wherein n>k, wherein within a complete pattern the redundant information fills a predetermined fixed fraction (n−k)/n of the pattern, said error correction means comprising, for each complete pattern:
   input means connected to a plurality of column outputs of the memory matrix for forming a local presyndrome (am) and at least one subsidiary syndrome symbol;
   second means connected to the input means for receiving at least one subsidiary syndrome symbol (bm) from a neighboring pattern in a first direction, if present, and for forming a local syndrome by means of the local presyndrome;
   combining means connected to the second means for forming, from the local syndrome and at least the one syndrome symbol of a neighboring pattern in a second direction, if present, a modification signal;
   modification means connected to the combining means for modifying an information signal under the control of a respective modification signal.

2. A semiconductor memory as claimed in claim 1 in which said repetitious pattern comprises at least n=4 columns; and comprising means for applying (n−1) bits to the first column selection means for each complete pattern; means for supplying at least one data bit of a directly neighboring pattern in a first direction, if present, to said second means; and means for supplying syndrome bits from a directly neighboring pattern in a first direction and from two consecutive directly neighboring patterns in a second direction, if present, to the combining means.

3. A semiconductor memory comprising:
   a memory matrix of rows and columns of memory cells for storing rows of data information and also error protective redundant information in a repetitious pattern of n columns;
   an on-chip error correction means coupled to column outputs of the memory matrix, for receiving one symbol for each accessed column according to an analogous repetitious pattern of columns related to an (n,k) spatial convolutional code, wherein (n>k), and assigning the redundant information to a predetermined number (n−k) of columns of the pattern in question for enabling a data symbol of the convolution code to be corrected for any constraint length of the code, and for exchanging syndrome bits and subsidiary syndrome bits between neighboring pattern periods; and
   first column selection means connected to said error correction means for presenting output signals for further use.

4. A semiconductor memory as claimed in claim 1 or 3, characterized in that said at least two patterns have mutually identical column configurations.

5. A semiconductor memory as claimed in claim 1 or 2 in which said spatial convolution code is a systematic code.

6. The semi-conductor memory of claim 5 in which each symbol comprises a single bit.

7. A semiconductor memory comprising:
   a memory matrix of rows and columns of memory cells for storing data information and error protective redundant information in rows in a repetitious pattern of at most n columns per row;
   on-chip error correction means connected to column outputs of the memory matrix for receiving one symbol for each accessed column according to an analogous repetitious pattern of columns related to an (n,k) spatial convolutional code, wherein (n>k), and assigning the redundant information to a predetermined number (n−k) of columns of the pattern for enabling a data symbol of the convolution code to be corrected for any constraint length of the code, and for exchanging syndrome bits and subsidiary syndrome bits between neighboring pattern periods;
   first column selection means coupled to said error correction means for generating output signals for further use.

8. A semiconductor memory as claimed in claim 7, in which the convolution code is systematic.

9. A semiconductor memory as claimed in claim 8 characterized in that each symbol consists of a single bit.

10. A semiconductor memory as claimed in claim 8, comprising disabling means connected to said error correcting means for ignoring a possible correction in response to an ignore correction signal.

11. A semiconductor memory as claimed in claim 8, comprisng substitution means for continuously addressing a substitute row of memory cells instead of a faulty row of memory cells.

12. A semiconductor memory as claimed in claim 8, in which the error corection means is activatable in response to a recurrent refresh signal in order to correct a correctable error.

13. A semiconductor memory as claimed claim 5, characterized in that the convolution code is not systematic, and comprising matrix inversion means coupled to the first column selection means.

14. A semiconductor memory as claimed in any one of the claims 1, 2, 5, 7, or 8, characterized in that the convolution code is an (n,n−1) code.

15. A semiconductor memory as claimed in claim 13 characterized in that each symbol consists of a single bit.

16. A semiconductor as claimed in claim 13, comprising disabling means connected to said error correcting means for ignoring a possible correction in response to an ignore correction signal.

17. A semiconductor memory as claimed in claim 13, comprising substitution means for continuously addressing a substitute row of memory cells instead of a faulty row of memory cells.

18. A semiconductor memory as claimed in claim 13, in which the error correction means is activatable in response to a recurrent refresh signal in order to correct a correctable error.

19. A semiconductor memory as claimed in claim 13 comprising an integrated circuit device.

20. A semiconductor memory as claimed in any of claims 1, 3 or 7, comprising second column selection means connected between the memory matrix and the error correction device.

21. A semiconductor memory as claimed in claim 20, in which the second column selection means has a smaller selection factor than that of the first column selection means.

22. A semiconductor memory as claimed in any one of the claims 1, 2, 3, 7, or 21 characterized in that $n = 2^j$, where $j > 3$.

23. A semiconductor memory as claimed in claim 22, in which $n = 2^j$ and comprising at least one incomplete final pattern, all incomplete final patterns comprising at least the predetermined number $(n - k)$ of columns of redundant information provided for each complete pattern in order to form therefrom syndrome bits and/or subsidiary syndrome bits in the error correction device.

24. A semiconductor memory as claimed in claim 22, comprising means for coupling syndrome bits and subsidiary syndrome bits from one end of the series of repetitious patterns to the other end of the series.

25. A semiconductor memory as claimed in any one of the claims 1, 2, or 5 in which said first column selection means are bidirectionally active, and comprising syndrome bit forming means, an output connected to a column input of each column of the predetermined fixed fraction for storing a restored redundancy bit formed from received information and the information remaining in the memory matrix.

26. A semiconductor memory as claimed in claims 25, in which the correction device is activatable in response to a recurrent refresh signal in order to correct a correctable error.

27. A semiconductor memory as claimed in any one of the claims 1, 2 or 5 comprising disabling means connected to said error correcting means for ignoring a possible correction in response to an ignore correction signal.

28. A semiconductor memory as claimed in any one of the claims 1, 3 or 7, comprising substitution means for continuously addressing a substitute row of memory cells instead of a faulty row of memory cells.

29. An integrated circuit comprising a semiconductor memory as claimed in any one of the claims 1, 3 or 7.

30. A semiconductor memory as claimed in claim 8 comprising an integrated circuit device.

31. In a memory having a matrix of rows and columns of memory cells for storing information symbols and error protective redundant symbols in rows of said memory cells, a method for encoding said error protective redundant symbols comprising:
dividing said rows of memory cells into a repetitive pattern of information cells and redundant cells;
storing said information symbols in said information cells;
spatially convolving the information symbols in said information cells in a row to generate said error protective redundant symbols; and
storing the error protective redundant symbols in the redundant cells of said row.

32. The method of claim 31 in which said spatially convolving step comprises repetitively applying a generator polynomial to the information symbols in a row for generating the redundant symbols.

33. In a memory having a matrix of rows and columns of memory cells for storing information symbols and error protective redundant symbols in rows of said memory cells, a method for correcting errors in the information symbols by using said error protective redundant symbols comprising:
dividing said rows of memory cells into a repetitive pattern of information cells and redundant cells;
storing said information symbols in said information cells;
spatially convolving the information symbols in said information cells with the error protective redundant symbols in a row to generate corrected information symbols; and
providing the corrected information symbols at an output of said memory.

* * * * *